United States Patent
Yang et al.

(10) Patent No.: US 9,432,019 B2
(45) Date of Patent: Aug. 30, 2016

(54) CONTROL CHIP AND SYSTEM USING THE SAME FOR POWER SAVING

(71) Applicant: REALTEK SEMICONDUCTOR CORP., Hsinchu (TW)

(72) Inventors: Chih-Yuan Yang, New Taipei (TW); Wen-Hsia Kung, Taoyuan County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/639,237

(22) Filed: Mar. 5, 2015

(65) Prior Publication Data

US 2016/0112045 A1  Apr. 21, 2016

(30) Foreign Application Priority Data

Oct. 17, 2014 (TW) .............................. 103135995 A

(51) Int. Cl.
 *G06F 1/32* (2006.01)
 *H03K 19/00* (2006.01)
(52) U.S. Cl.
 CPC ................................ *H03K 19/0016* (2013.01)
(58) Field of Classification Search
 CPC ...... G06F 1/32; G06F 1/3203; G06F 1/3234; G06F 1/3287
 See application file for complete search history.

(56) References Cited

U.S. PATENT DOCUMENTS 7,365,596 B2 * 4/2008 Padhye ............... G06F 13/4072
                                                         327/200
9,009,501 B2 * 4/2015 Chen .................... G06F 1/3206
                                                         713/1

FOREIGN PATENT DOCUMENTS

TW            M463466 U      10/2013

* cited by examiner

*Primary Examiner* — Jeffrey Zweizig
(74) *Attorney, Agent, or Firm* — Li & Cai Intellectual Property (USA) Office

(57) ABSTRACT

A control chip for power saving is provided. The control chip is configured to operatively receive a first voltage and a first bias voltage. The control chip includes a microcontroller unit and a low power module. The low power module is coupled to the microcontroller unit. The microcontroller unit receives the first voltage to control the operation of at least one component under an operating mode and to stop receiving the first voltage under a power saving mode. The low power module operatively receives the first bias voltage. When the microcontroller unit switches from the operating mode to the power saving mode, the low power module operatively generates a first control signal to cause the microcontroller unit to stop receiving the first voltage. When the low power module detects a trigger signal, the power module operatively generates a second control signal to cause the microcontroller unit to continue receiving the first voltage.

18 Claims, 3 Drawing Sheets

CONTROL CHIP AND SYSTEM USING THE SAME FOR POWER SAVING

BACKGROUND

1. Technical Field

The present disclosure relates to a power control chip, in particular to a control chip and a system using the same for power saving.

2. Description of Related Art

As technology rapidly develops, people's dependence on using electronic apparatuses, such as air-conditioners, refrigerators, computers, washers, and the like, in their daily life increases. Electronic apparatuses however cannot operate without "power", and the issue of power saving thus arose. As more and more electronic apparatuses are being used nowadays, the issue of power saving becomes an important issue that needs to be addressed. Thus, "low power" has become the subject of future research for most industries and the demands or requirements for power saving also become strict.

Please refer to FIG. 1, which shows a diagram of a conventional power saving control system. For example, a conventional power saving control system 1 for a monitor includes a first-order LDO regulator 11, a second-order LDO regulator 12, and a control chip 13. The control chip 13 includes a microcontroller 131. The second-order LDO regulator 12 is coupled to the first-order LDO regulator 11. The first-order LDO regulator 11 and the second-order LDO regulator 12 are coupled to the control chip 13, respectively.

Generally, the conventional monitor operatively receives an input voltage VI (e.g., 12V/14V/19V), converts the input voltage VI received into a first voltage V1 (e.g., 5V) with the first-order LDO regulator 11, and converts the first voltage V1 received into a second voltage V2 (e.g., 3.3V) with the second-order LDO regulator 12. The first voltage V1 and the second voltage V2 are respectively supplied to power the control unit 13 thereafter. However, in practice, the first voltage V1 and the second voltage V2 not only are supplied to power the control unit 13, but also used to power other external components that are coupling to the second-order LDO regulator 12 and the first-order LDO regulator 11.

Conventionally, the control chip 13 is unable to directly disconnect itself from receiving the driving voltage (i.e., the voltages supplied by the first-order LDO regulator 11 and the second-order LDO regulator 12) even when the conventional monitor is operated under a power saving mode, and the control chip 13 instead is operated in a low-power standby state. Therefore, the external components coupling to the second-order LDO regulator 12 and the first-order LDO regulator 11 would continue to consume the power as the first-order LDO regulator 11 and the second-order LDO regulator 12 cannot be stopped. In other words, the external components would continually receive the first and second voltages and consume power even when the control chip 13 is completely powered down.

SUMMARY

An exemplary embodiment of the present disclosure provides a control chip for power saving. The control chip is configured to operatively receive a first voltage and a first bias voltage. The control chip includes a microcontroller unit and a low power module. The low power module is coupled to the microcontroller unit. The microcontroller unit receives the first voltage for controlling the operation of at least one component under an operating mode and stops receiving the first voltage under a power saving mode. The low power module operatively receives the first bias voltage. When the microcontroller unit switches from the operating mode to the power saving mode, the low power module operatively generates a first control signal to cause the microcontroller unit to stop receiving the first voltage. When the low power module detects a trigger signal, the low power module operatively generates a second control signal to cause the microcontroller unit to continue receiving the first voltage.

An exemplary embodiment of the present disclosure provides a control system for power saving. The control system includes a switching regulator, an external voltage biasing circuit, and a control chip. The control chip includes a microcontroller unit and a low power module. The control chip is coupled to the switching regulator and the external voltage biasing circuit. The low power module is coupled to the microcontroller unit. The switching regulator supplies a first voltage. The external voltage biasing circuit operatively supplies a first bias voltage. The microcontroller unit operatively receives a first voltage for controlling the operation of at least one component under an operating mode and stops receiving the first voltage under a power saving mode. The low power module receives the first bias voltage. When the microcontroller unit switches from the operating mode to the power saving mode, the low power module operatively generates a first control signal to cause the microcontroller unit to stop receiving the first voltage. When the low power module detects a trigger signal, the low power module operatively generates a second control signal to cause the microcontroller unit to continue receiving the first voltage.

To sum up, the control chip and the control system provided by exemplary embodiments of the present disclosure are operable to achieve power saving for an electronic apparatus. More specifically, in order for a conventional control system to keep the microcontroller unit operating in the power saving mode, the conventional control system must continuously receive power, and the voltage regulator for supplying power to the microcontroller unit and other components coupling thereto has to continue to operate and consume power, which is a waste of power. Thus, an exemplary embodiment of the present disclosure replaces the conventional used microcontroller unit with a control chip having a low power module integrated therein and the control chip is operable to detect and determine the waking-up operation of the electronic apparatus using simple digital circuitries, and operable to directly turn off the microcontroller unit and the voltage regulator, thereby effectively achieve power saving effect.

In order to further understand the techniques, means and effects of the present disclosure, the following detailed descriptions and appended drawings are hereby referred to, such that, and through which, the purposes, features and aspects of the present disclosure can be thoroughly and concretely appreciated, however, the appended drawings are merely provided for reference and illustration, without any intention that they be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
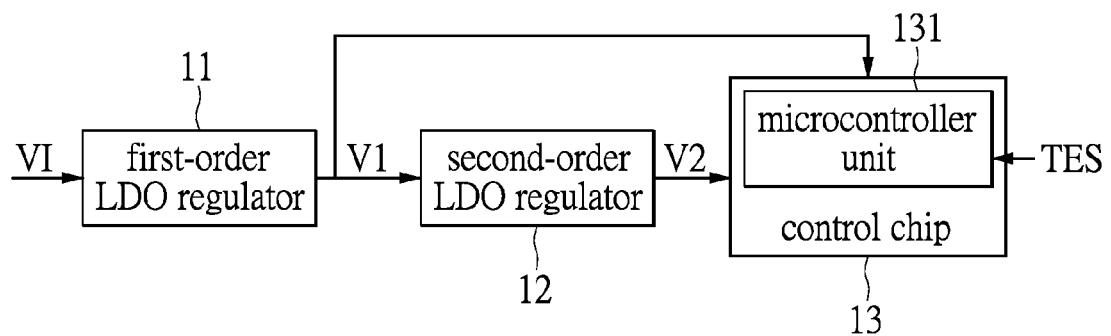
FIG. 1 is a diagram of a conventional control system for power saving.

Reference will now be made in detail to the exemplary embodiments of the present disclosure, examples of which are illustrated in the accompanying drawings. However, they may be embodied in different forms and should not be construed as limited to the embodiments set forth herein. In the accompanying drawings, the relative thickness of layers and regions may be exaggerated for clarity. Wherever possible, the same reference numbers are used in the drawings and the description to refer to the same or like parts.

Exemplary embodiments of the present disclosure provide a control chip and a control system for power saving. The control chip and the control system are operable to resolve the issue of the electronic apparatus wasting power under a power saving mode thereof by preventing the electronic apparatus from consuming power supplied by the LDO regulator even under the power saving mode. The exemplary embodiment of the present disclosure replaces the original microcontroller unit with a control chip having a low power module integrated therein and the control chip is operable to automatically detect and determine the waking-up operation of the electronic apparatus, and correspondingly control the on/off operation of the switching regulator, thereby effectively achieve the objective of power saving. Although the following exemplary embodiments are illustrated with a display or a monitor, persons skilled in the art should understand that the concepts disclosed by embodiments of the present disclosure are also applicable to any electronic apparatus having the power saving mode. The present disclosure is not limited thereto. The control chip and the control system for power saving are illustrated in detail in the following paragraphs.

Figure 2:
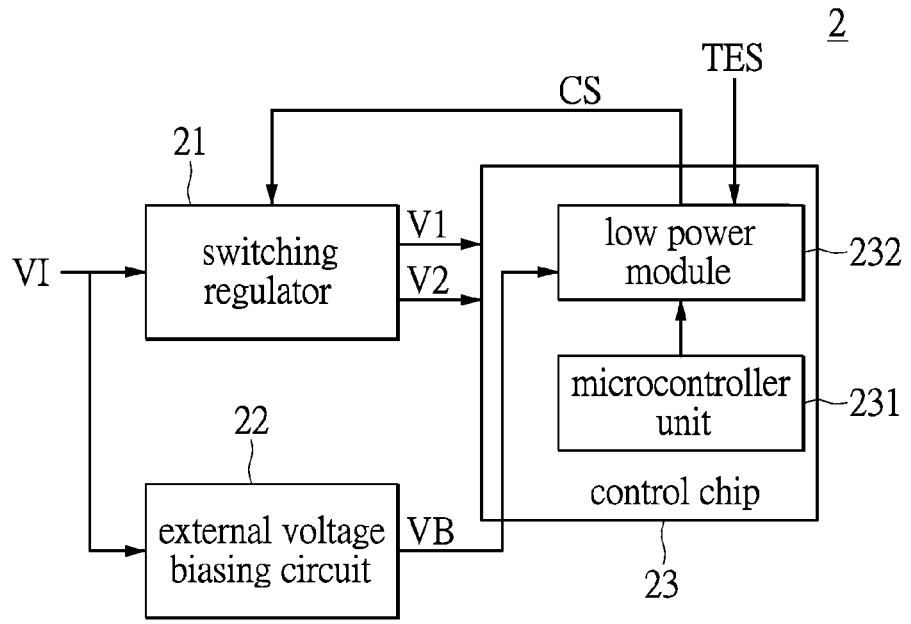
FIG. 2 is a diagram of a control system for power saving provided according to an exemplary embodiment of the present disclosure.

Please refer to FIG. 2, which shows a diagram illustrating a control system for power saving provided according to an exemplary embodiment of the present disclosure. A control system 2 for power saving includes a switching regulator 21, an external voltage biasing circuit 22, and a control chip 23. The control chip 23 further includes a microcontroller unit 231 and a low power module 232. The switching regulator 21 and the external voltage biasing circuit 22 are coupled to the control chip 23. The low power module 232 is coupled to the microcontroller unit 231.

The switching regulator 21 is configured to operatively convert an input voltage VI (e.g., 12V/14V/19V) received and generate the first voltage V1 (e.g., 5V) and the second voltage V2 (e.g., 3.3V) for supplying necessary power to the control unit 23 and other external components coupling thereto. In the instant embodiment of the present disclosure, the switching regulator 21 is implemented with a switch voltage regulator. In other embodiments, the switching regular 21 may be implemented with a linear series regulator or the equivalents. Thus, the present disclosure does not limit the exact type or implementation of the switching regulator 21.

The external voltage biasing circuit 22 is operable to supply a first external voltage VB to the low power module 232 of the control chip 23. In the instant embodiment of the present disclosure, the control system 2 for power saving has the external voltage biasing circuit 22 disposed between a voltage source for generating the input voltage V1 and the control chip 23. The external voltage biasing circuit 22 generates the first external voltage VB by voltage division. In the instant embodiment of the present disclosure, the external voltage biasing circuit 22 is implemented by a fixed-value resistor and generates a voltage same as the second voltage V2. However, the external voltage biasing circuit 22 can also be implemented with an adjustable or tunable resistor, which can be adjusted by an operator based on the operational needs, and the present disclosure is not limited thereto. It shall be noted that the configuration of the external voltage biasing circuit 22 in the instant embodiment is able to operatively provide an input current of less than 10 μA to the control chip 23.

The control chip 23 is configured to operatively control the operation of at least one circuit component coupling thereto. In the instant embodiment of the present disclosure, the control chip 23 is configured to have an operating mode and a power saving mode. However, in another embodiment, the power saving mode may be set as a sleep mode or any other equivalent mode. Specifically, the operating mode is the working or active state of the control chip 23. The power saving mode is the standby state or speed reduction state of the control chip 23. Under the operating mode, the control chip 23 drives the microcontroller unit 231 to control the operation of circuit components (e.g., audio codec, fan, or the like.) coupling thereto upon receiving the first voltage V1 and the second voltage V2. The control chip 23 stops to receive the first voltage V1 under the power saving mode. Moreover, the control chip 23 operatively receives the first bias voltage VB and drives the low power module 232 to detect a trigger signal TES. In the instant embodiment of the present disclosure, the microcontroller unit 231 is implemented with an 8051-based microcontroller. However, those skilled in the art should understand that the microcontroller unit 231 can be implemented based on the operational requirement of the electronic apparatus, and the present disclosure does not limit the exact type and the exact implementation used for the microcontroller unit 231. It is worth noting that since the switching regulator 21 is shutdown or turned off under the power saving mode, circuit components that receive the first voltage V1 and the second voltage V2 thus will not consume power, the present disclosure therefore achieves the objective of power saving for electronic apparatus.

In detail, when the microcontroller unit 231 has switched from the power saving mode to the operating mode, the low power module 232 operatively outputs a control signal CS to turn off the switching regulator 21 to stop the microcontroller unit 231 from receiving the first voltage V1 and the second voltage V2. The low power module 232 outputs the control signal CS to turn on the switching regulator 21 to cause the microcontroller unit 231 to continue receiving the first voltage V1 and second voltage V2 upon detecting the trigger signal TES In other words, the control signal CS outputted by the low power module 232 is configured to selectively turn on or turn off the switching regulator 21. The control signal CS is generated responsive to the trigger signal TES to cause the microcontroller unit 231 to continue receiving the first voltage V1 and second voltage V2. However, it shall be noted that the low power module 232 in the instant embodiment receives the first bias voltage VB under either the operating mode or the power saving mode for constantly detecting the trigger signal TES.

Figure 3:
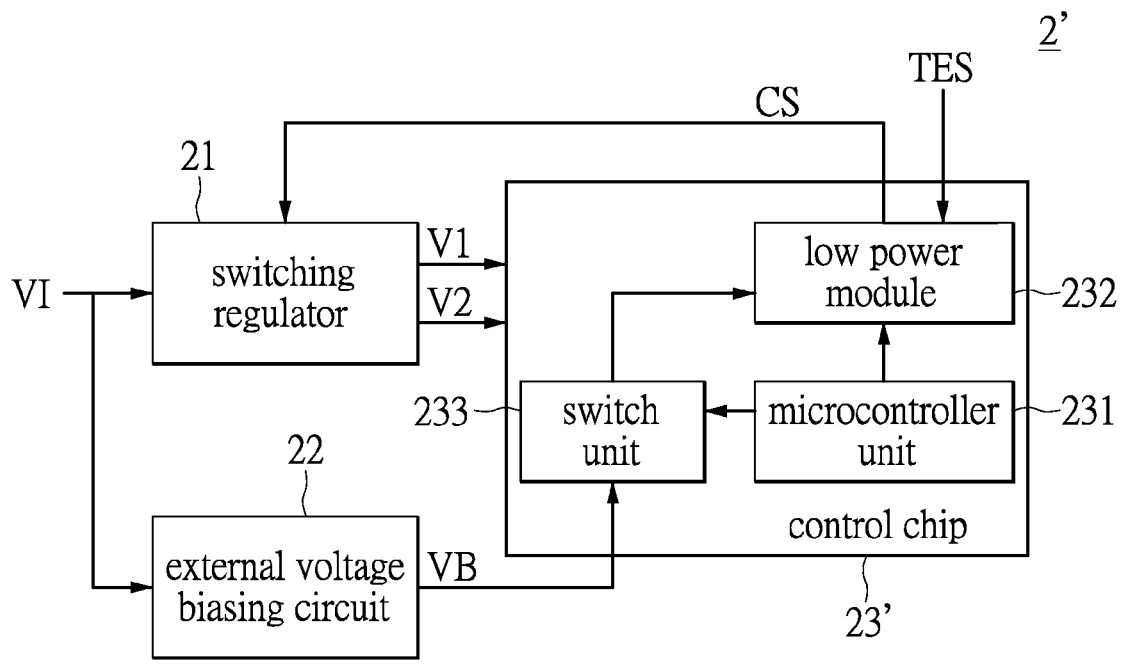
FIG. 3 is a diagram of a control system for power saving provided according to another exemplary embodiment of the present disclosure.

Please refer to FIG. 3, which shows a diagram illustrating a control system for power saving provided according to another exemplary embodiment of the present disclosure. In the instant embodiment, the control system 2' is essentially the same as the control system 2, and the difference is that a control chip 23' of the control system 2' further includes a switch unit 233. The switch unit 233 is disposed on the current path formed between the low power module 232 and the external voltage biasing circuit 22 for receiving the first bias voltage VB from the external voltage biasing circuit 22. The switch unit 233 is controlled by the microcontroller unit 231. In other words, the switch unit 233 operatively controls the low power module 232 whether or not to receive the first bias voltage VB. In the instant embodiment of the present disclosure, the switch unit 233 can be implemented with a metal oxide semiconductor field effect transistor (MOSFET). More specifically, before the control chip 23' has switched from the operating mode to the power saving mode, the microcontroller unit 231 turns on the switch unit 233 and causes the low power module 232 to receive the first bias voltage VB supplied from the external voltage biasing circuit 22 for the control chip 23' to conduct the low power detection operation. At the meantime, the low power module 232 generates the control signal CS to turn off the switching regulator 21, and the control chip 23' stops receiving the first voltage V1 and the second voltage V2 supplied by the switching regulator 21. Additionally, after the control chip 23' has switched from the power saving mode to the operating mode, the microcontroller unit 231 turns off the switch unit 233, and causes the low power module 232 to stop receiving the first bias voltage VB and prevents the low power module 232 from consuming power.

Figure 4:
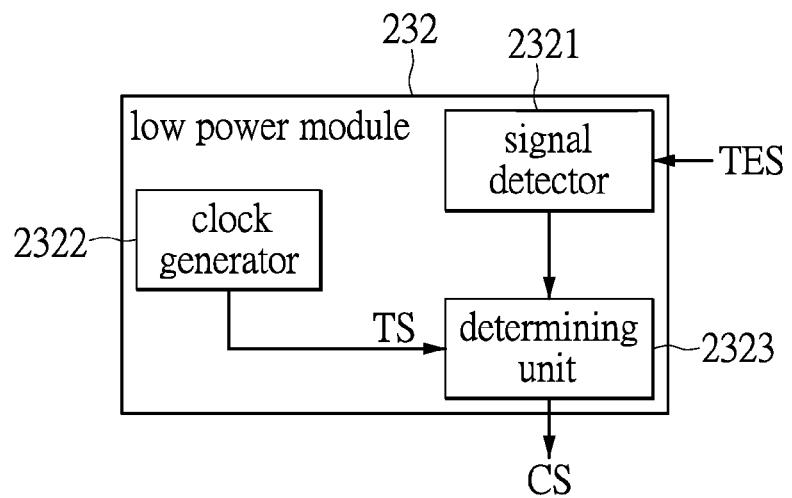
FIG. 4 is a diagram of a low power module provided according to an exemplary embodiment of the present disclosure.

The details on the operations of the low power module 232 are illustrated in the following paragraphs. Please refer to FIG. 4, which shows a diagram illustrating a low power module provided according to an exemplary embodiment of the present disclosure. The low power module 232 includes a signal detector 2321, a clock generator 2322, and a determining unit 2323. The determining unit 2323 is coupled to the signal detector 2321 and the clock generator 2322.

The signal detector 2321 comprises of necessary circuitries, logics and/or codes for operatively detecting the trigger signal TES. More specifically, the signal detector 2321 is configured to detect a change in the logic level of the trigger signal TES, i.e., detects the level transition from high logic level to low logic level or from low logic level to high logic level.

The clock generator 2322 including comprises of necessary logics, circuitries, and/or codes for operatively generating a clock signal TS. In the instant embodiment of the present disclosure, the clock generator 2322 can be implemented with an embedded oscillator that can generate a 2 KHz clock signal TS with a positive feedback digital circuit and a sixth order distributed first-in-first-out circuit. In practice, the clock generator 2322 also can be implemented with an oscillator formed of other circuitry elements for generating clock signals TS at different frequency based on practical operational needs or users' requirement, and the present disclosure is not limited thereto.

Figure 5:
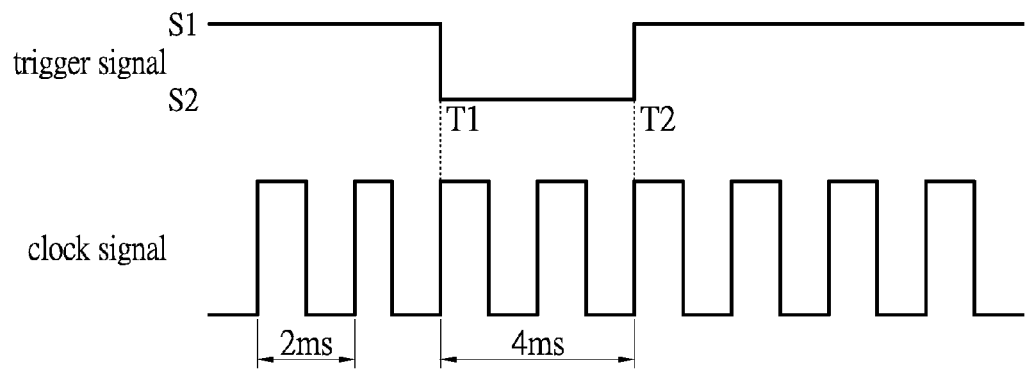
FIG. 5 is a diagram illustrating a counting operation of a determining unit provided according to an exemplary embodiment of the present disclosure.

The determining unit 2323 comprises of necessary logics, circuitries, and/or codes such that the determining unit 2323 operatively starts counting the trigger signal TES according to the clock signal TS received from the clock generator 2322 when the signal detector 2321 detects a logic level change in the trigger signal TES. Moreover, the determining unit 2323 generates the control signal CS after counting the trigger signal TES for a time interval. That is, the determining unit 2323 starts counting the trigger signal TES when the signal detector 2321 detects the trigger signal TES under the power saving mode and generates the control signal CS after an elapse of the time interval. Please refer to FIG. 5 in conjunction with FIG. 4, which shows a diagram illustrating a counting operation of a determining unit provided according to the exemplary embodiment of the present disclosure. When the signal detector 2321 detects the trigger signal TES changed from a voltage level S1 to a voltage level S2, the determining unit 2323 starts counting. The determining unit 2323 operatively generates the control signal CS after the counting time reaching the time interval T1~T2 (e.g., 4 ms in FIG. 5). It is worth to note that the time interval may be configured and preset by the manufacturer, and the present disclosure is not limited thereto.

Figure 6:
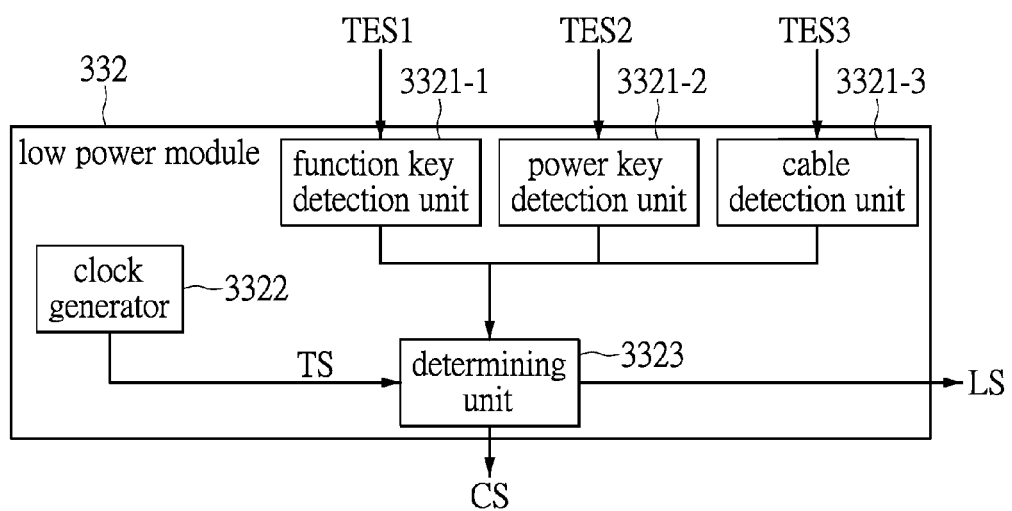
FIG. 6 is a diagram of a low power module provided according to another exemplary embodiment of the present disclosure.

Next, please refer to FIG. 6 in conjunction with FIG. 2, which shows a diagram illustrating a low power module provided according to another exemplary embodiment of the present disclosure. The difference between a low power module 332 in FIG. 6 and the low power module 232 in FIG. 2 is in that the low power module 332 has multiple signal detectors including a function key detection unit 3321-1, a power key detection unit 3321-2, and a cable detection unit 3321-3 as shown In FIG. 6.

In the instant embodiment, the function key detection unit 3321-1 is configured to detect the functional keys of the monitor such as "MENU", "UP", "DOWN", "LEFT", and "RIGHT" under the power saving mode. The function key detection unit 3321-1 herein is a 32-level decoder, and is configured to assist the determining unit 3323 in identifying which functional key has pressed by user. Similarly, the determining unit 3323 starts counting according to the clock signal TS generated by the clock generator 3322 when the function key detection unit 3321-1 detects a change in the logic level of a trigger signal TES1 generated as the user presses one of the functional keys "MENU", "UP", "DOWN", "LEFT", and "RIGHT".

In the instant embodiment, the power key detection unit 3321-2 is configured to detect a power key of the monitor under power saving mode. Similar to the signal detector 2321 of the embodiment in FIGS. 3-4, the power key detection unit 3321-2 operatively detects the change in the logic level of a trigger signal TES2 generated as the user presses down the power key. Similarly, the determining unit 3323 starts counting according to the clock signal TS generated by the clock generator 3322 when the power key detection unit 3321-2 detects a change in the logic level of a trigger signal TES2.

The cable detection unit 3321-3 is configured to detect when a cable is connected to or disconnect from the monitor under the power saving mode. More specifically, when the cable connects to the general purpose input/output of the monitor, the determining unit 3323 starts counting according to the clock signal TS generated by the clock generator 3322 when the cable detection unit 3321-3 detects a change in the logic level of a trigger signal TES3.

The determining unit 3323 operatively starts counting upon receiving any one of the trigger signals TES1-TES3 and generates the control signal CS to turn on switching regulator 21 after counted the time interval, and causes the microcontroller unit 231 to continue receiving the first voltage V1 and the second voltage V2 supplied by the switching regulator 21.

It is worth noting that the determining unit 3323 further is operable to generate light signals corresponding to different trigger signal TES1-TES3 for controlling display lights (not shown) to show the current operating mode or state for the monitor.

To sum up, the control chip and the control system provided by exemplary embodiments of the present disclosure are operable to achieve power saving for an electronic apparatus. More specifically, in order for a conventional control system to keep the microcontroller unit operating in the power saving mode, the conventional control system must continuously receive power and the voltage regulator for supplying power to the microcontroller unit and other components coupling thereto has to continue to operate and consume power, which is a waste of power. Thus, the exemplary embodiment of the present disclosure replaces the conventionally used microcontroller unit with a control chip having a low power module integrated therein and the control chip is operable to detect and determine the waking-up operation of the electronic apparatus using simple digital circuitries, and operable to directly turn off the microcontroller unit and the voltage regulator, thereby effectively achieve power saving effect. It is worth noting that the low power module of the present disclosure can control the total current received by the control chip to be lower than 10 μA while the control system is operated under the power saving mode.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A control chip for power saving, operable to receive a first voltage generated from a switching regulator and a first bias voltage generated from a voltage biasing circuit, the control chip comprising:
    a microcontroller unit, operatively receiving the first voltage for controlling the operation of at least one component under an operating mode, and stopping receiving the first voltage under a power saving mode; and
    a low power module coupled to the microcontroller unit, operatively receiving the first bias voltage;
    wherein the low power module operatively generates a first control signal to turn off the switching regulator to stop the microcontroller unit from receiving the first voltage when the microcontroller unit has switched from the operating mode to the power saving mode; the low power module operatively generates a second control signal responsive to a trigger signal to turn on the switching regulator to cause the microcontroller unit to continue receiving the first voltage.

2. The control chip according to claim 1, wherein the low power module further comprises:
    a clock generator, operative to generate a clock signal; and
    a determining unit coupled to the clock generator;
    wherein the low power module operatively counts a time interval by counting the clock signal upon detecting the trigger signal and generates the second control signal after the time interval.

3. The control chip according to claim 2, wherein the low power module further comprises:
    a signal detector coupled to the determining unit, the signal detector configured to detect the trigger signal.

4. The control chip according to claim 3, wherein the trigger signal is a change in the logic level, and the signal detector operatively causes the determining unit to start counting upon detecting the change in the logic level.

5. The control chip according to claim 2, wherein the frequency of the clock signal generated by the clock generator is 2 KHz.

6. The control chip according to claim 1, wherein the low power module operable to continually receive the first bias voltage under either the operating mode or the power saving mode.

7. The control chip according to claim 1, further comprising:
    a switch unit coupled to the microcontroller unit, operatively controlling the operation of the low power module for receiving the first bias voltage;
    wherein the microcontroller unit operatively turns off the switch unit to stop the low power module from receiving the first bias voltage when the control chip has switched from the power saving mode to the operating mode.

8. The control chip according to claim 7, wherein the microcontroller unit operatively turns on the switch unit and causes the low power module to receive the first bias voltage before the control chip switches from the operating mode to the power saving mode.

9. A control system for power saving, comprising:
    a switching regulator, supplying a first voltage;
    an external voltage biasing circuit, operatively supplying a first bias voltage; and
    a control chip coupled to the switching regulator and the external voltage biasing circuit, the control chip comprising:
        a microcontroller unit, operatively receiving the first voltage for controlling the operation of at least one component under an operating mode, and stopping receiving the first voltage under a power saving mode; and
        a low power module coupled to the microcontroller unit, operatively receiving the first bias voltage;
        wherein the low power module operatively generates a first control signal to cause the microcontroller unit to stop receiving the first voltage when the micro controller unit has switched from the operating mode to the power saving mode; the low power module operatively generates a second control signal responsive to a trigger signal to cause the microcontroller unit to continue receiving the first voltage.

10. The control system according to claim 9, wherein the low power module further comprises:
    a clock generator, operable to generate a clock signal; and
    a determining unit coupled to the clock generator;
    wherein the low power module operatively counts a time interval by counting the clock signal upon detecting the trigger signal and generates the second control signal after the time interval.

11. The control system according to claim 10, wherein the low power module further comprises:

a signal detector coupled to the determining unit, the signal detector configured to detect the trigger signal.

12. The control system according to claim 11, wherein the trigger signal is a change in the logic level, and the signal detector operatively causes the determining unit to start counting upon detecting the change in the logic level.

13. The control system according to claim 10, wherein the frequency of the clock signal generated by the clock generator is 2 KHz.

14. The control system according to claim 9, wherein the low power module operative to continually receive the first bias voltage under either the operating mode or the power saving mode.

15. The control system according to claim 9, further comprising:
a switch unit coupled to the microcontroller unit, operatively controlling the operation of the low power module for receiving the first bias voltage;
wherein the microcontroller unit operatively turns off the switch unit to stop the low power module from receiving the first bias voltage after the control chip switches from the power saving mode to the operating mode.

16. The control system according to claim 15, wherein the microcontroller unit operatively turn on the switch unit and causes the low power module to receive the first bias voltage before the control chip switches from the operating mode to the power saving mode.

17. The control system according to claim 14, wherein the low power module generates a second control signal to selectively turn off the switching regulator.

18. The control system according to claim 9, wherein the switching regulator is a switching voltage regulator.

* * * * *